(12) United States Patent
Hensel et al.

(10) Patent No.: US 12,315,585 B2
(45) Date of Patent: May 27, 2025

(54) AUTOMATED TEST EQUIPMENT COMPRISING A PLURALITY OF COMMUNICATION INTERFACES TO A DEVICE UNDER TEST

(71) Applicant: Advantest Corporation, Tokyo (JP)

(72) Inventors: Frank Hensel, Böblingen (DE); Olaf Pöppe, Tübingen (DE)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 17/665,314

(22) Filed: Feb. 4, 2022

(65) Prior Publication Data
US 2022/0157399 A1    May 19, 2022

Related U.S. Application Data

(63) Continuation of application No. PCT/EP2019/071086, filed on Aug. 6, 2019.

(51) Int. Cl.
*G11C 29/56* (2006.01)
*G01R 31/319* (2006.01)

(52) U.S. Cl.
CPC ........ *G11C 29/56* (2013.01); *G01R 31/31905* (2013.01); *G11C 2029/5602* (2013.01)

(58) Field of Classification Search
None
See application file for complete search history.

(56) References Cited

U.S. PATENT DOCUMENTS

| | | | |
|---|---|---|---|
| 6,424,926 B1 | 7/2002 | Mak | |
| 6,975,954 B2 | 12/2005 | Mak et al. | |
| 7,068,082 B2 | 6/2006 | Kojima | |
| 7,083,428 B1 * | 8/2006 | Mahoney | H01R 13/2421 |
| | | | 439/70 |
| 8,170,828 B2 | 5/2012 | McNamara et al. | |

(Continued)

FOREIGN PATENT DOCUMENTS

| | | |
|---|---|---|
| JP | 2000148527 | 5/2000 |
| JP | 2001051863 | 2/2001 |

(Continued)

OTHER PUBLICATIONS

"A software-based self-test methodology for system peripherals," Grosso et al., 2010 15th IEEE European Test Symposium.

(Continued)

*Primary Examiner* — Guerrier Merant

(57) ABSTRACT

The automated test equipment is configured to establish communication, e.g. by uploading a program to the DUT using a first interface, such as a debug interface or a generic interface having access to the processing unit for external control. A typical use case of the first interface is debug access to the DUT, which typically requires limited data rates. In the case of the invention the first interface is an ATE access for test execution. The first interface configures the DUT to open a second interface running at much higher data rate, which is higher than the first interface, for additional communication. Additionally, the second interface may have extended capabilities compared to the first interface, such as presenting its own memory to the processing unit of the DUT as a normal system memory.

18 Claims, 6 Drawing Sheets

(56) References Cited

U.S. PATENT DOCUMENTS

| | | | |
|---|---|---|---|
| 8,583,973 B1* | 11/2013 | Chakravarty | G01R 31/31703 714/733 |
| 9,959,186 B2 | 5/2018 | Hutner et al. | |
| 10,288,681 B2 | 5/2019 | Champoux et al. | |
| 10,317,463 B2 | 6/2019 | Sonawane et al. | |
| 10,496,506 B2 | 12/2019 | Fkih et al. | |
| 10,768,230 B2 | 9/2020 | Casatuta et al. | |
| 10,976,361 B2 | 4/2021 | Malisic et al. | |
| 2001/0023490 A1 | 9/2001 | Gloeckler et al. | |
| 2003/0084388 A1 | 5/2003 | Williamson, Jr. et al. | |
| 2003/0235156 A1 | 12/2003 | Gygi | |
| 2004/0177238 A1 | 9/2004 | Tagawa | |
| 2005/0099199 A1 | 5/2005 | Sugita | |
| 2007/0234146 A1* | 10/2007 | Watanabe | G01R 31/31919 714/724 |
| 2008/0126903 A1* | 5/2008 | Wegener | G01R 31/31921 714/E11.148 |
| 2010/0312517 A1 | 12/2010 | McNamara et al. | |
| 2011/0078525 A1 | 3/2011 | Xia et al. | |
| 2012/0179946 A1* | 7/2012 | Chakravarty | G01R 31/318544 714/E11.169 |
| 2012/0233504 A1* | 9/2012 | Patil | G06F 11/2242 714/E11.02 |
| 2014/0229782 A1 | 8/2014 | Rueter | |
| 2014/0236524 A1 | 8/2014 | Frediani et al. | |
| 2014/0236527 A1 | 8/2014 | Chan et al. | |
| 2017/0370988 A1 | 12/2017 | Motika et al. | |
| 2018/0095129 A1* | 4/2018 | Deutsch | G11C 29/4401 |
| 2018/0348299 A1* | 12/2018 | Mistry | G01R 31/3177 |
| 2019/0004112 A1* | 1/2019 | Chakravarty | H04L 43/0847 |
| 2020/0033405 A1* | 1/2020 | Chan | G01R 31/3177 |
| 2021/0025938 A1 | 1/2021 | Poppe et al. | |
| 2021/0117298 A1 | 4/2021 | Su et al. | |
| 2022/0121542 A1* | 4/2022 | Khare | G06F 13/4282 |
| 2022/0196734 A1* | 6/2022 | Paterson | G01R 31/31715 |

FOREIGN PATENT DOCUMENTS

| | | | | |
|---|---|---|---|---|
| JP | 2005045428 | | 2/2005 | |
| JP | 2010278471 | | 12/2010 | |
| JP | 6557220 | B2 | 8/2019 | |
| KR | 20150119869 | A | 10/2015 | |
| KR | 101950731 | B1 | 2/2019 | |
| KR | 101970290 | B1 | 4/2019 | |
| KR | 101984353 | B1 | 5/2019 | |
| KR | 102000957 | B1 | 7/2019 | |
| KR | 101993504 | B1 | 9/2019 | |
| KR | 20190107183 | A | 9/2019 | |
| KR | 102043487 | B1 | 11/2019 | |
| KR | 102100533 | B1 | 4/2020 | |
| TW | 201337236 | A | 9/2013 | |
| TW | 201433802 | A | 9/2014 | |
| TW | 201337296 | | 3/2015 | |
| WO | WO-2008093312 | A1 * | 8/2008 | G01R 31/318508 |
| WO | WO-2018027018 | A1 * | 2/2018 | G06F 11/0706 |
| WO | 2021023372 | A1 | 2/2021 | |

OTHER PUBLICATIONS

T4 Data Sheet; www.efinixinc.com; DST4-V3.5; Feb. 2023; 29 Pages.

* cited by examiner

AUTOMATED TEST EQUIPMENT COMPRISING A PLURALITY OF COMMUNICATION INTERFACES TO A DEVICE UNDER TEST

RELATED APPLICATIONS

The present Application is a Continuation of PCT Application Number PCT/EP2019/071086 to HENSEL and PÖPPE, filed 6 Aug. 2019, which is incorporated herein by reference in its entirety.

FIELD OF INVENTION

Embodiments according to the invention are related to automatic test equipment for testing a device under test which comprises a processing unit and a memory. The memory can comprise program and/or data memory.

Further embodiments according to the invention are related to automatic test equipment which comprises a test controller, one or more computer interfaces and a shared memory. Further embodiments according to the invention are related to a method for testing a device under test (DUT).

Embodiments of the present invention relate generally to testing of digital semiconductor devices and more specifically to a system type testing during device manufacturing.

Further embodiments according to the invention are related to memory extension method for on-chip-system tests.

BACKGROUND

For the production test of digital semiconductor devices, structural test methodologies are widely applied. However, these tests focus on a certain complex function implementation or intellectual property (IP) block(s) in a multi-IP digital semiconductor design. Therefore, the IP blocks, which might be originating from different IP sources and/or vendors, as such are typically structurally well testable with the help of structural design-for-test techniques. These structural tests test the logic function and they are performed in test modes.

In the final application of a digital semiconductor design, for example, in a mission and/or operation mode, a device operates typically or mainly not in a test mode but in its mission mode.

If the semiconductor is a system on a chip (SOC) or a system in a package (SIP), an internal and/or external processing unit or central processing unit (CPU) may execute commands and/or program code to work with data exchanged among the IP blocks. Interaction of the IP blocks may introduce new mechanisms of cross-IP erroneous behavior. These might be design related and/or process related.

While an initial system turn on of a new design may be aimed at finding design errors, more and more semiconductor manufacturers work on establishing system type testing during device manufacturing, in order to find process-related defects. Mission mode operation may be required in this test step in order to establish internal communication or prove cross-IP functionality.

Typical building blocks of a SOC or SIP design are, for example, a processing unit (PU), a computer infrastructure like cache memories for instructions and/or data (e.g. L2 Cache), peripheral logic and design specific and/or custom IP blocks.

In a production test stage, the system these SOC chips are designed for is not complete yet. Components like external memory, mass storage, power management etc. are only partly available, because such components may be added at later production stages, e.g. during packaging or assembly on an application board.

Therefore, for example, the storage of program code to be executed on a processing unit at wafer level is generally very limited, for example, limited to the memory resources which are on chip, like small memory banks and/or a cache memory that might be re-configured to serve as a memory. That means the test program code and the data to be worked with needs to be very small in order to fit into those resources. One needs to find ways to work around this limitation like separating test content into smaller pieces.

Off-chip memory interfaces can typically not be served at wafer probe test insertion. They require wide buses, very short traces and/or roundtrip times which require wire lengths of typically less than 1 cm. Additionally, much more pins are required, because these memory interfaces are typically reused as test ports for the structural testing. Integrating the memory functionality in the automatic test equipment (ATE) generally provides limited help because of the need of wide buses and in particular the need of very short traces and/or roundtrip times, cannot be served properly.

High Speed Input/Output (HSIO) buses, like Peripheral Component Interface Express (PCIe™), Universal Serial Bus (USB), Serial Peripheral Interface (SPI), are narrow but high speed. Similar as for the processing unit debug port, ATE coverage is possible and widely in usage in the ATE industry, for parametric signal verification purposes.

In order to extend the available amount of RAM memory, some designs are known to have special design for testability (DfT) hardware, which allows re-purposing the L2 Cache memory as additional RAM, e.g., by turning off caching algorithms.

Using an on-die RAM for execution of a Test Case Program only or exclusively provides limitations in size. Furthermore, a program needs to be completely loaded before an execution may start. Thus a loading time through JTAG and/or through another Debug Port is relatively limited. Moreover, a similar indirect access to the test results via the Debug Port mechanisms is needed.

Enabling an extension of the RAM size by repurposing the L2 Cache memory as RAM requires a special DfT. While a cache functionality generally requires storing a start address of a so-called cache line and the corresponding cache line data, and a continuous memory area needs to be formed, the DfT needs to turn these mechanisms off in order to prevent that a program code is automatically overwritten. This option has been published, but has rarely been observed or applied, due to its complexity.

Using External Memory modules, such as RAM, ROM, Flash ROM, etc., on board results in a high usage of device pins, prohibiting their use for test access, and creates a structural test gap. Furthermore this option needs high maintenance and/or diagnosis effort, such as verifying the circuitry, verifying and/or replacing the program content. Moreover, if not combined with a Debug Access Port, this option provides a limited visibility of test results, that means a summary is signaled on single device under test (DUT) bits.

The program uploaded to the DUT via the second interface performs functional test on the DUT which is desirable as semiconductor devices are well known to display different characteristics in terms of e.g. power consumption in test mode compared to its mission mode.

There is hence a need for a concept which allows an increase in the size and/or availability of the memory of the DUT during a functional test of the DUT and/or which allows a faster and/or monitored and/or protected communication between the DUT and the ATE.

SUMMARY OF THE INVENTION

An embodiment of the present invention may include an ATE for testing a DUT, which comprises a processing unit and a program and/or data memory, wherein the processing unit is able to execute code from a program and/or data memory. The automated test equipment is configured to upload a program to the DUT using a first interface, such as, for example, a debug interface or a Debug Access Port (DAP) or a generic interface having access to the processing unit for external control.

A typical use case of the first interface is software debugging, which is typically undesirably slow. In the case of the invention the first interface may, for example, be an ATE access for test execution, such as an interface which allows to access internal DUT functionality.

The program uploaded to the DUT via the first interface configures the DUT to open a second interface running at higher data rate, (for example, at a much higher data rate) which is, for example, higher (or even much higher) than the data rate of the first interface, for additional communication.

For example, an ATE, which is configured to upload and run a program on a DUT, may open a second interface, which may have a higher data rate, thus reducing the time spent on testing the DUT. The second interface may additionally ha re the possibility to serve as program and/or data memory and/or provides other functionalities not available using the first interface.

In accordance with embodiments of the present invention, a test can be accelerated by providing a program to a DUT via a first comparatively slow interface, which opens a second, comparatively fast interface, which may, for example, need some configuration and/or a driver software.

Thus, the second interface may support a communication between the ATE or tester and the DUT and/or may allow the DUT to access a memory which may, for example, be provided by the tester and which may, for example, be useful when performing testing.

However, while the second interface may not be operational or fully operational upon power-up, the program uploaded by the tester using the first interface, which may be a simple interface which is available without a software-driver configuration procedure and/or without a driver software, may activate, initiate, and/or configure the second interface and thereby enable an improved test. Using the first interface to download initial program codes into DUT memory also addresses the issue that an one-time-programmable ROM, which might be present on the chip, cannot be used: It will be programmed usually at a later state in the production flow with application ROM code and hence cannot be used to configure the second device for interaction with ATE, also for security reasons.

Thus, by using a two-step procedure, in which a first interface is needed to provide a program to the DUT which activates the second interface, a DUT can be brought into a state in which an external memory can be accessed in order to allow complex testing.

According to embodiments, the program uploaded to the DUT via the first interface may execute one or more of the following steps:

The uploaded program configures the DUT and/or the connected blocks using the DUT, for example, a memory of the DUT, in order to load additional program code and/or data via a second interface. The second interface may comprise or communicate with a higher data rate, which is higher than the data rate of the first interface, if the program is executed by the DUT, such as for example, the program is executed from a shared memory of the automated test equipment. The second interface may additionally have the possibility to serve as program and/or data memory and/or provides other functionalities not available using the first interface.

The uploaded program controls the execution of one or more programs.

The uploaded program sets registers of the DUT to desired values.

The uploaded program configures a memory access of the DUT, such as, for example, for a random access.

The uploaded program is configured to configure the DUT, which may include loading additional programs and data, executing one or more programs, setting the register values and/or the memory access of the DUT. Configuring the DUT may have the benefits of setting up a faster communication between the DUT and the ATE or mapping a shared memory, which may result in running programs from the shared memory and/or reading/writing data from/to the shared memory.

In accordance with embodiments of the present invention, a program uploaded to the DUT via the first interface is configured to configure the DUT to access the second interface using a memory mapping. This may be realized, for example, by writing appropriate values to memory mapping control registers of the DUT. And this may result in, for example, that the content of a shared memory of the ATE, which is coupled to the DUT via the second interface, appears to the processing unit of the DUT as a memory, for example as a memory connected to a system bus of the DUT. This may result in extending the addressable memory of the DUT.

According to embodiments, a program uploaded to the DUT via the first interface is configured to configure a resource manager of the DUT to allocate a memory subrange of a memory range addressable by the processing unit of the DUT for an access to the second interface. The program may configure the resource manager such that the content of a shared memory of the ATE, which is coupled to the DUT via the second interface, appears to the processing unit of the DUT as a memory in the allocated memory subrange. This may result in extending the memory of the DUT.

In accordance with embodiments of the present invention, the program uploaded to the DUT is configured to communicate to the ATE either as a client or as a host, utilizing an appropriate application protocol to exchange data with its counterpart, for example, with the ATE.

For example, the exchanged data might include, among others, compiled code snippets, setup and/or configuration data, measurement result data and/or register values. The DUT may be configured to form an independent computer system.

According to embodiments, the ATE may be configured and/or required to authenticate and/or authorize itself against the first and/or second interface.

For example, the ATE may be configured to authenticate and/or authorize itself using cryptographic means and/or secret credentials. For example, the authentication may be required in order to prove its identity required to, for example, establish a communication. For example, the authorization may be required in order to gain privileges on the device, for example, to access otherwise restricted functions. For example, the required authentication and/or authorization results in an increased security.

In accordance with embodiments of the present invention, the ATE may be configured and/or required to communicate with the DUT, by using the first and/or second interface, in an encrypted manner and/or in a manner which is protected against modifications.

For example, the communication is configured to be protected against modifications by using standard and/or proprietary data integrity checking methods, such as hashes. For example, the communication is configured to be encrypted by using standard and/or proprietary encryption schemes and/or methods. Using a protected and/or encrypted communication results in an increased security.

According to embodiments, the ATE may be configured and/or required to communicate with the DUT, by using the first and/or second interface, in a compressed manner by using standard and/or proprietary, lossy and/or lossless compaction means, wherein the automatic test equipment is configured to compress the data to send to the DUT and to decompress the data received from the DUT.

Sending and/or receiving compressed data is more time-effective than sending and/or receiving non-compressed data.

In accordance with embodiments of the present invention, the program uploaded to the DUT via the first and/or second interface comprises a program code for performing the compaction and/or decompaction method to perform the compression and/or decompression.

For example, the compaction and/or decompaction method is used only in a test mode, and there may be no obligation for a DUT to comprise the compaction and/or decompaction method in a mission and/or operation mode.

According to embodiments, the ATE is configured to cause the processing unit of the DUT to execute a test case code and/or a test case program, which is stored in a shared memory of the ATE and which is loaded onto the DUT via the second interface.

For example, the test case code appears to the processing unit of the DUT to be located in a memory subrange of a memory range addressable by the processing unit of the DUT. For example, the test case code is adapted to test, when executed by the processing unit of the DUT, one or more functionalities of the DUT. Storing and/or executing a test case code in a shared memory of the ATE is reducing the DUT memory required in a test mode. Also, the ATE can easily manage test case programs stored in a shared memory of the ATE.

In accordance with embodiments of the present invention, the ATE is configured to cause an invalidation of a cache, or of a cache region, before the DUT executes a test case code which is stored in a shared memory of the ATE and which is loaded to the DUT via the second interface. The second interface may additionally have the possibility to serve as program and/or data memory and/or provides other functionalities not available using the first interface.

Invalidation of a cache, or of a cache region, in a test mode may, for example, result in separating the test mode and the mission and/or the operation mode, such that the cache and/or cache region may remain free from programs and/or data of the test mode and data in the cache and/or cache region may not be overwritten by the test process.

Further benefits of an invalidation of a cache, or of a cache region, may, for example, be that the data or auxiliary data, generated during the test process may be stored in a shared memory and may be, for example, evaluated by the ATE. Testing and/or evaluating these data as well may result in, for example, a qualitative improvement of the test process, by improving the amount and/or type of input data.

According to embodiments, the program uploaded to the DUT using the first interface is configured to initialize the processing unit of the DUT and to initialize the second interface of the DUT. Furthermore, the program is configured to configure the second interface of the DUT to connect to a shared memory of the ATE and to provide a memory range of the shared memory of the ATE as a memory range usable by the processing unit of the DUT, by for example, using a memory mapping. The shared memory range may be, for example, accessible by using a memory access instruction and/or an opcode.

Benefits of a shared memory may, for example, be that both the ATE and the DUT have access to the memory, thus speeding up the tests, by eliminating the need both saving and sending/receiving data between the ATE and the DUT, and by allowing the ATE to exchange information close to real-time, on-the-fly, for example, whenever the content of the shared memory changes.

In accordance with embodiments of the present invention, the program uploaded to the DUT using the first interface is configured to initialize the memory range, onto which the memory range of the memory of the ATE is mapped, to be cached by a cache, such as an L2 Cache, of the device under test.

This may result in, for example, that an extension memory provided by the second interface is presented to the processing unit of the DUT as a normal system memory, except for a possibly slower access time.

The second interface may additionally have the possibility to serve as program and/or data memory and/or provides other functionalities not available using the first interface.

This may further result in, for example, a shared memory between the ATE and the DUT, which could have the benefits, for example, that both the ATE and the DUT have access to the memory, thus allowing the ATE to test close to real-time, on-the-fly, for example, whenever the content of the shared memory changes.

According to embodiments, the program uploaded to the DUT using the first interface is configured to initialize the memory range, onto which the memory range of the shared memory of the ATE is mapped, such that an extension memory provided by the second interface is presented to the processing unit of the DUT as a normal system memory, such as a random access memory, except for a possibly slower access time. The memory of the "host", which may mapped into the memory region of the device under test, is cached, such that a test program may be executed with reasonable speed.

This may result in, for example, that an extension memory provided by the second interface is presented to the processing unit of the DUT as a normal system memory, except for a possibly slower access time.

This may further result in, for example, a shared memory between the ATE and the DUT, which could have the benefits, for example, that both the ATE and the DUT have access to the memory, thus allowing the ATE to test close to real-time, on-the-fly, for example, whenever the content of the shared memory changes.

In accordance with embodiments of the present invention, the program uploaded to the DUT using the first interface is configured to make the DUT to transfer results of a program execution to the ATE via the second interface, in order to, for example, store results of a program execution in a shared memory of the automated test equipment via the second interface.

Benefits of a shared memory may, for example, be that both the ATE and the DUT have access to the memory, thus speeding up the tests, by eliminating the need both saving and sending/receiving data between the ATE and the DUT, and by allowing the ATE to test close to real-time, on-the-fly, for example, whenever the content of the shared memory changes.

According to embodiments, the ATE is configured to perform a data analysis on the basis of the results stored in the memory of the ATE via the second interface, which may additionally have the possibility to serve as program and/or data memory and/or provides other functionalities not available using the first interface.

The ATE may be further configured to perform a characterization of the DUT, such as for example, a pass/fail computation, on the basis of the results stored in the memory of the ATE via the second interface.

The ATE may be further configured to evaluate a data access pattern to the memory of the ATE via the second interface in order to, for example, characterize the DUT and/or to perform a pass/fail detection.

The ATE may be farther configured to analyze on-the-fly information received from the device under test via the second interface, in order to characterize the DUT.

In accordance with embodiments of the present invention, the ATE is configured to cause the DUT to sequentially and/or in parallel execute a plurality of test case programs, for example, in case of a multi-core DUT. This would, for example, generate different stress patterns, and may potentially be more realistic. The test case programs are stored in different memory ranges of a shared memory of the ATE which are accessed by the DUT via the second interface. For example, a parallel execution and/or evaluation of test cases may have the benefit of speeding up the test process by running different tests on different cores.

According to embodiments, the program uploaded to the DUT via the first interface is configured to configure the DUT to load program code and/or data of a given test case program via the second interface during an execution of the given test case program, thus expanding the memory of the DUT and may, for example, use and/or test the cache in operation mode, instead of in a test mode.

For example, whenever a new opcode is required by the processing unit of the DUT, for example, the program loads program code and/or data from a memory region covered by the shared memory coupled to the second interface.

For example, whenever an opcode is fetched by a cache mechanism of the DUT, for example, the program loads program code and/or data from a memory region covered by the shared memory coupled to the second interface, in an assumption that it may or will be needed by the processing unit of the DUT.

According to embodiments, the ATE comprises a test controller. Furthermore, the ATE comprises the first interface, such as a debug interface, in order to provide test data to the DUT. Moreover the ATE comprises a shared memory which is accessible by the test controller and which is accessible by the DUT, for example, via the second interface.

The ATE may provide the DUT with test data over a first or second interface. Furthermore, for example, the ATE may comprise a test controller and a shared memory. Both the DUT and the test controller may have access to the shared memory, which improves the data exchange between the DUT and the ATE. Furthermore it may result in a close-to real-time, on-the-fly testing, wherein the ATE may execute the test whenever the data in the shared memory changes.

In accordance with embodiments of the present invention, the ATE comprises a test controller. Furthermore, the ATE comprises a first interface, such as a debug interface, in order to provide test data to the DUT. Moreover the ATE comprises a shared memory which is ac accessible by the test controller and which is accessible by the DUT, for example, via the second interface, which comprises a higher data rate than the first interface. The second interface, which may be a high-speed interface, may be comprised by another debug interface running at high data-rate, which may be, for example, constructed for tests.

Furthermore, the second interface, may be an interface typical for the end-application of the DUT in application mode, such as, but not limited to PCIe or USB. This option may also provide an advantage for a system test coverage of the DUT tests.

According to embodiments, the ATE comprises a high-speed serial interface, which is configured to allow an access of the DUT to the shared memory.

The high-speed serial interface may comprise one serial data channel, or also may comprise two or more serial data channels and may serve as the second interface. The high-speed serial interface (HSIO) may also be a host interface client configured to handle an access of the DUT to the shared memory of the ATE.

Furthermore the HSIO interface may scale with bandwidth needs of test or final application, which may be important for an interface test coverage.

In accordance with embodiments of the present invention, the serial interface is a PCI-Express interface or a PCI-Express compliant interface, such as a PCI Express™ or a PCIe™.

Using common serial interfaces, like PCI Express™ and/or a PCIe™ interface(s), may result in a greater variety of usable existing connectors and/or interfaces and/or the benefits of using the already existent interfaces, which may reduce complexity and/or costs.

In accordance with embodiments of the present invention, the serial interface is a Universal-Serial-Bus (USB) interface, such as, for example, a USB 1.0 interface, or a USB 1.1 interface, or a USB 2.0 interface, or a USB 3.0 interface, or a USB 3.1 interface, or a USB 3.1 Gen 1 interface, or a USB 3.1 Gen 2 interface, or a USB 3.2 interface, or a USB 4 interface, or any other interface standardized by the USB implementers forum and being backward compatible to the interfaces mentioned in here.

Using common serial interfaces, like different versions of USB interfaces, may result in a greater variety of usable existing connectors and/or the benefits of using the already existent interfaces, which may reduce complexity and/or costs.

In accordance with embodiments of the present invention, the serial interface is a Thunderbolt, or an Ethernet or an IEEE-1394, an IEEE-1500, an IEEE-1687, an IEEE-1149 such as an IEEE-1149.10 interface or a SATA-interface, which may be, for example, a SATA interface, or a SATA Express interface, or an eSATA interface, or a mini-SATA-interface, or any other interface which is backward compatible to these interfaces. Furthermore the serial or second interface may be part of the first interface.

Generally speaking, for example, the serial interface, like any other HSIO interface, is suitable for uni- and/or bi-directional exchange of data, which also may include specialized debug and test interfaces.

Using common serial interfaces, like Thunderbolt, Ethernet, SATA/eSATA or IEEE-1394, IEEE-1500, IEEE-1687, IEEE-1149 interfaces, may result in a greater variety of usable existing connectors and/or the benefits of using the already existent interfaces, which may reduce complexity and/or costs.

In accordance with embodiments of the present invention, the ATE is configured such that the shared memory is accessible by multiple DUTs. Sharing a memory across multiple DUTs may reduce costs and/or the number of memory and/or test controllers used in cases where DUTs are tested parallel. Depending on the desired test objective, each DUT may access the completed shared memory or a restricted area only.

In accordance with embodiments of the present invention, the ATE comprises a plurality of interfaces, such as, for example, host interface clients, coupled to the shared memory, to allow access to the shared memory by a plurality of DUT.

A plurality of interfaces coupled to the shared memory allows an access to the shared memory by a plurality of DUT. Sharing a memory across multiple DUTs may reduce costs and/or the number of memory and/or test controllers used in cases where several DUTs are tested parallel.

According to embodiments, the test controller is configured to select which portion or which memory range of the shared memory is currently accessible by the DUT. The test controller may eventually be configured to change the selection when a new test case program is to be executed. The test controller may be configured to select portion(s), such as memory range(s), of the shared memory and allocate it/them to a plurality of DUTs.

Allocating memory ranges of the shared memory dynamically may result in an adaptive test process, which results in a reduction of the memory overhead. The tests may be more memory efficient, thus reducing the risk of running out of memory, for example, when testing DUTs parallel.

According to embodiments, the test controller is configured to change an allocation of portions of the shared memory to a given DUT during a test run, such that a first portion of the shared memory is allocated to a given DUT during a first part of the test run, and such that a second portion of the shared memory is allocated to the given DUT during a second part of the test run.

Allocating different memory ranges of the shared memory to different test processes may result in separating the test processes, in such way that different test cases and/or data of/from different test cases cannot interact with each other.

According to embodiments, the ATE is configured to modify a currently unused portion of the shared memory, to set up a new test case program, while the DUT accesses another portion of the shared memory.

Setting up new test cases in order to use unused memory ranges of the shared memory may result in speeding up the test process. Using all the available memory for test purposes makes the test process more time- and/or memory-efficient.

According to embodiments, the ATE is configured to read out data stored in the shared memory by the DUT from the shared memory, while the DUT accesses another portion of the shared memory.

As test cases are separated from each other, meaning using separate memory portions of the shared memory for different test cases, reading out and evaluating former test results may be executed, while other tests are running on the DUT, for example, the DUT is reading/writing data from/on other portions of the shared memory.

According to embodiments, the ATE is configured to analyze the data stored in the shared memory by the DUT, in order to obtain a test result, such as a pass/fail information or a quantitative information about a performance of the DUT.

Test data may be analyzed by the ATE in order to obtain a test result, a qualitative and/or quantitative information, which may be a pass/fail information and/or a measurement, about the DUT. According to the test result(s) the quality of the DUT may be determined.

Further embodiments according to the present invention create respective methods.

However, it should be noted that the methods are based on the same considerations as the corresponding apparatuses. Moreover, the methods may be supplemented by any of the features, for functionalities and details which are described herein with respect to the apparatuses, both individually and taken in combination.

BRIEF DESCRIPTION OF THE DRAWINGS

The accompanying drawings, which are incorporated in and form a part of this specification, illustrate embodiments of the invention and, together with the description, serve to explain the principles of the invention. Unless otherwise noted, the drawings may not be drawn to scale.

DETAILED DESCRIPTION

Figure 1:
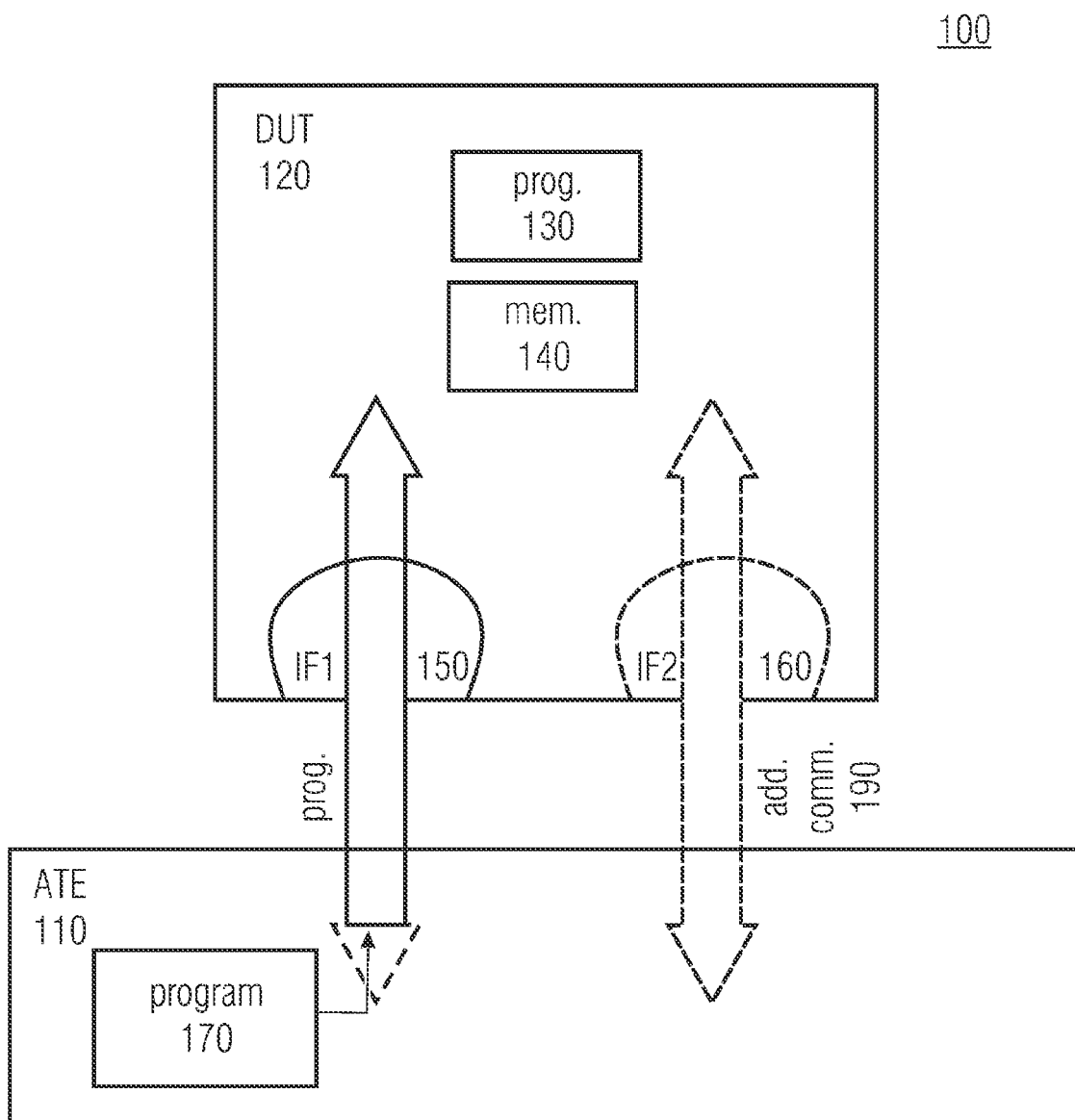
FIG. 1 shows a schematic diagram of an exemplary test arrangement, which comprises an embodiment of an ATE and a DUT having a processing unit (PU), a memory, a first interface and a second interface, in accordance with embodiments of the present invention.

In the following description, embodiments are discussed in detail, however, it should be appreciated that the embodiments provide many applicable concepts that can be embodied in a wide variety of applications referring to device testing and DUT interfaces. The specific embodiments discussed are merely illustrative of specific ways to implement and use the present concept, and do not limit the scope of the embodiments. In the following description of embodiments, the same or similar elements or elements that have the same functionality are provided with the same reference sign or are identified with the same name, and a repeated description of elements provided with the same reference number or being identified with the same name is typically omitted. Hence, descriptions provided for elements having the same or similar reference numbers or being identified with the same names are mutually exchangeable or may be applied to one another in the different embodiments. In the following description, a plurality of details is set forth to provide a more thorough explanation of embodiments of the disclosure. However, it will be apparent to one skilled it the art that other embodiments may be practiced without these specific details. In other instances, well-known structures and devices are shown in block diagram form rather than in detail in order to avoid obscuring examples described herein. In addition, features of the different embodiments described herein may be combined with each other, unless specifically noted otherwise.

In the following, different inventive embodiments and aspects will be described. Also, further embodiments will be defined by the enclosed claims.

It should be noted that any embodiments as defined by the claims may be supplemented by any of the details (features and functionalities) described herein. Also, the embodiments described herein may be used individually, and may also optionally be supplemented by any of the details (features and functionalities) included in the claims. Also, it should be noted that individual aspects described herein may be used individually or in combination. Thus, details may be added to each of said individual aspects without adding details to another one of said aspects. It should also be noted that the present disclosure describes explicitly or implicitly features usable in an ATE. Thus, any of the features described herein may be used in the context of an ATE.

Moreover, features and functionalities disclosed herein relating to a method may also be used in an apparatus (configured to perform such functionality). Furthermore, any features and functionalities disclosed herein with respect to an apparatus may also be used in a corresponding method. In other words, the methods disclosed herein may be supplemented by any of the features and functionalities described with respect to the apparatuses.

The invention will be understood more fully from the detailed description given below and from the accompanying drawings of embodiments of the invention, which, however, should not be taken to limit the invention to the specific embodiments described, but are for explanation and understanding only.

Test Arrangement According to FIG. 1

FIG. 1 shows a schematic representation of a test arrangement 100 which comprises an embodiment of an ATE 110 and a DUT 120.

The DUT 120 further comprises a processing unit 130, a memory 140, a first interface 150 and a second interface 160, which comprises a higher data-rate than the first interface 150. For example, the processing unit, the memory, the first and second interface may be coupled via one or more buses or interconnective structures. Both the first interface 150 and the second interface 160 are connected to the ATE 110. The ATE 110 comprises a program 170 to be uploaded onto the DUT 120.

The ATE 110 is configured to upload the program 170 to the DUT 120 using the first interface 150, wherein the first interface 150 may optionally allow bidirectional communication. For example, the ATE may potentially read out DUT status information and/or DUT values and further information over the first interface 150.

The program 170 uploaded via the first interface 150 is configured to configure the DUT 120 to open and/or configure the second interface 160 for an additional communication 190. The second interface 160 is configured to run at a higher or much higher data-rate than the first interface 150, which is, for example, a slow interface and/or a debug interface.

The ATE 110 benefits from the configured second interface 160 in a way that any additional communication 190 between the ATE 110 and the DUT 120 is much faster than through the first interface 150. That means that means sending and/or receiving program code and/or test data, and/or the test process itself is accelerated. Also, a memory of the DUT 120 may be extended using the second interface.

Figure 2:
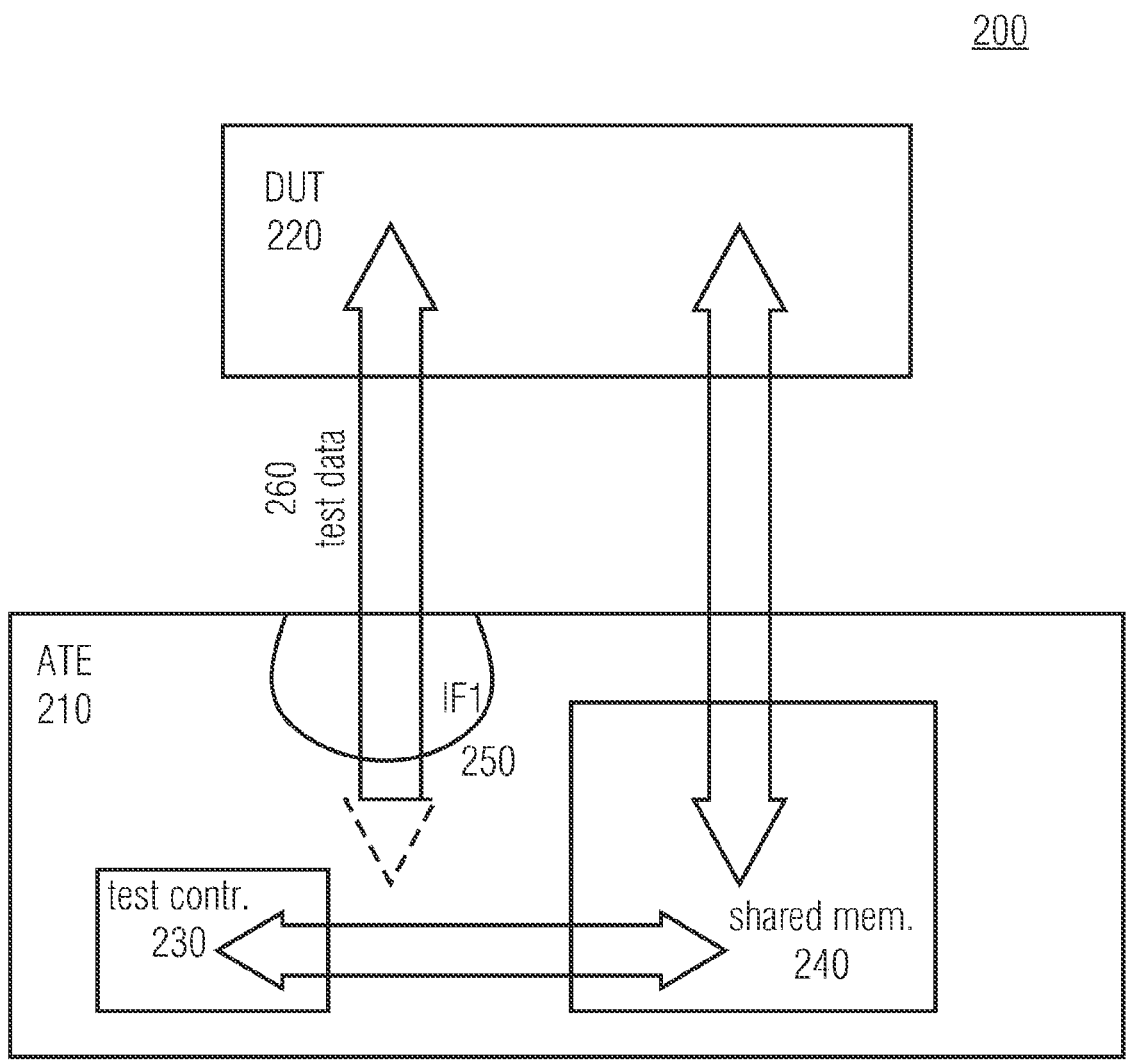
FIG. 2 shows a schematic diagram of an exemplary test arrangement which comprises a DUT and an embodiment of an ATE having a first interface, a test controller and a memory accessible by the test controller and the DUT, in accordance with embodiments of the present invention.

Test Arrangement According to FIG. 2

FIG. 2 shows a schematic representation of a test arrangement 200 which comprises an embodiment of an ATE 210, similar to ATE 110 on FIG. 1, and a DUT 220, similar to DUT 120 on FIG. 1.

The ATE 210 comprises a test controller 230, a shared memory 240 and a first interface 250. Furthermore the ATE 210 is connected to the DUT 220 via the first interface 250. The first interface 250 is not necessarily unidirectional, it may optionally allow bidirectional communication as well. The shared memory 240 of the ATE 210 is connected to the test controller 230 and to the DUT 220, for example, via a second interface.

The ATE 210 is configured to send test data 260 over the first interface 250 to the DUT 220. The DUT 220 has an access to the shared memory 240, for example, via a second interface which has a higher data rate than the first interface 250. The shared memory 240 is also accessible by the test controller 230 of the ATE 210.

As described on FIG. 1, the ATE 110 is configured to upload a program 170 in order to configure the fast second interface 160 of the DUT 120.

In result, the shared memory 240 of the ATE 210 is accessible by the test controller 230 and by the DUT 220 over a fast, second interface of the PUT 220. Both the DUT 220 and the test controller 230 is able to write data to and/or read data from the shared memory 240, while the ATE 210 is also able to send test data 260 to the DUT 220 via the first interface 250, e.g. to control test execution.

Using the shared memory 240 of the ATE 210 extends the memory of the DUT 220 and eliminates the need of sending/receiving data between the ATE 210 and DUT 220. Data are copied on/read out from the shared memory 240 instead.

Figure 3:
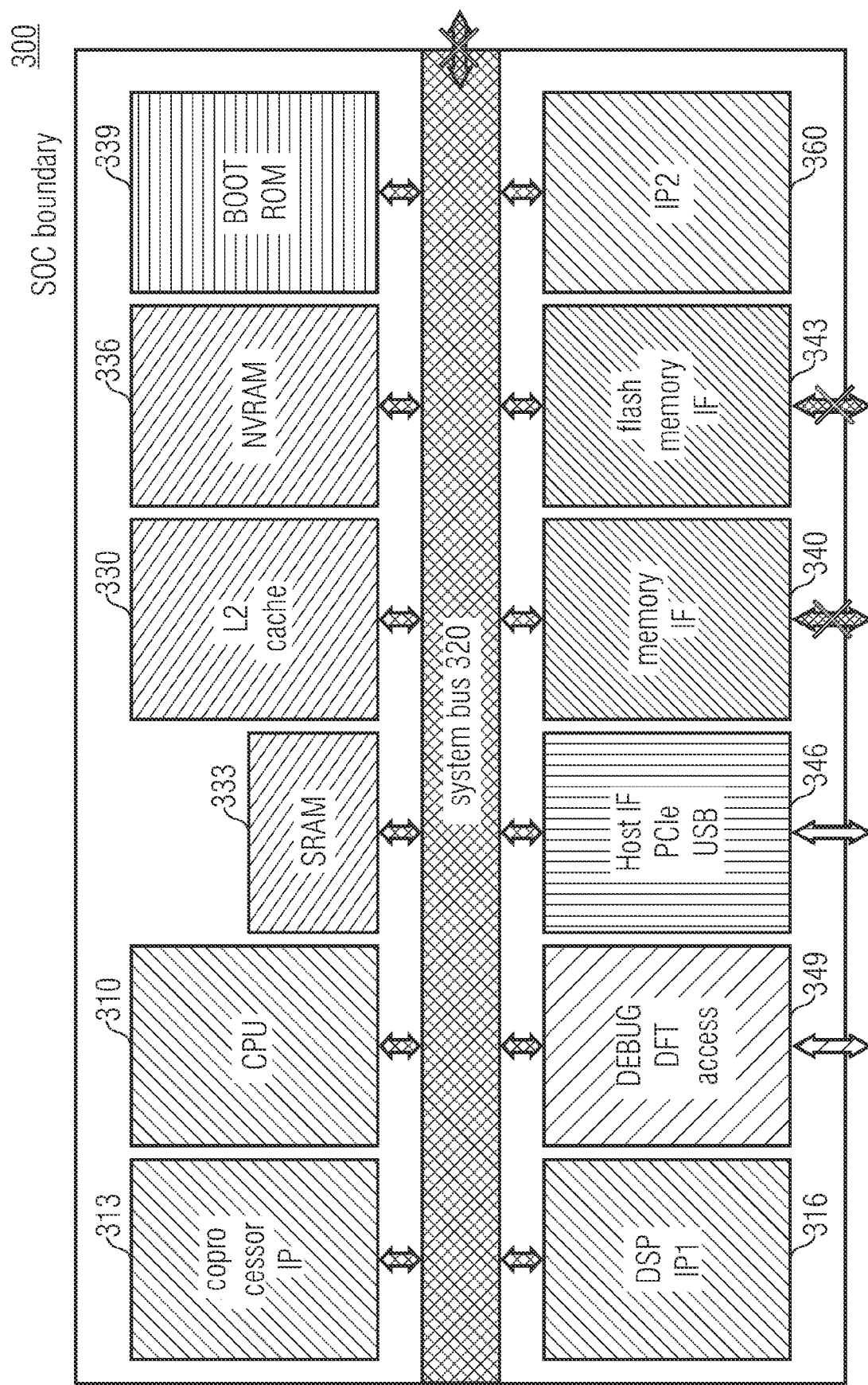
FIG. 3 shows a schematic diagram of an exemplary SOC, in accordance with embodiments of the present invention.

DUT According to FIG. 3

FIG. 3 shows a typical DUT 300 to be tested, for example, in a test arrangement 100 in FIG. 1.

Typical building blocks of a DUT 300, or a SOC design, are processing units, computer infrastructure, peripheral logic and other custom IP blocks 360 connected by a system bus 320.

Typical processing units are, for example, a processing unit 310, a coprocessor 313, or a digital signal processor (DSP) 316, etc.

Typical computer infrastructure are, for example, a level 2 cache (L2 Cache) 330, an SRAM 333, an NVRAM 336, a BOOT ROM 339 etc.

Typical periphery is, for example, a memory interface 340, a flash memory interface 343, a debug DfT interface 349, Host interfaces 346, such as, PCIe, USB etc.

Typically in the production test stage, the system these SOC chips are designed for is not complete yet. Components like external memory or mass storage 340, power management etc. are only partly available, because such components may be added at later stages, for example, during packaging or assembly in an application board.

During functional test, the Host interface of the SOC design is typically operated in a mission and/or operational mode.

The storage of program code to be executed on a processing unit 310 at wafer level is very limited, for example, limited to the memory resources which are on chip like small memory banks 333 or 336 and a cache memory 330 that may be reconfigured to serve as a memory.

An ATE 110, similar to the ATE on FIG. 1 is configured to upload a program over the debug DfT interface 349. The program uploaded is configured to open and/or set a connection between the DUT 300 and the ATE over the Host interface 346, for example, over a PCIe or a USB interface, which allows a fast connection between the ATE and the DUT.

Figure 4:
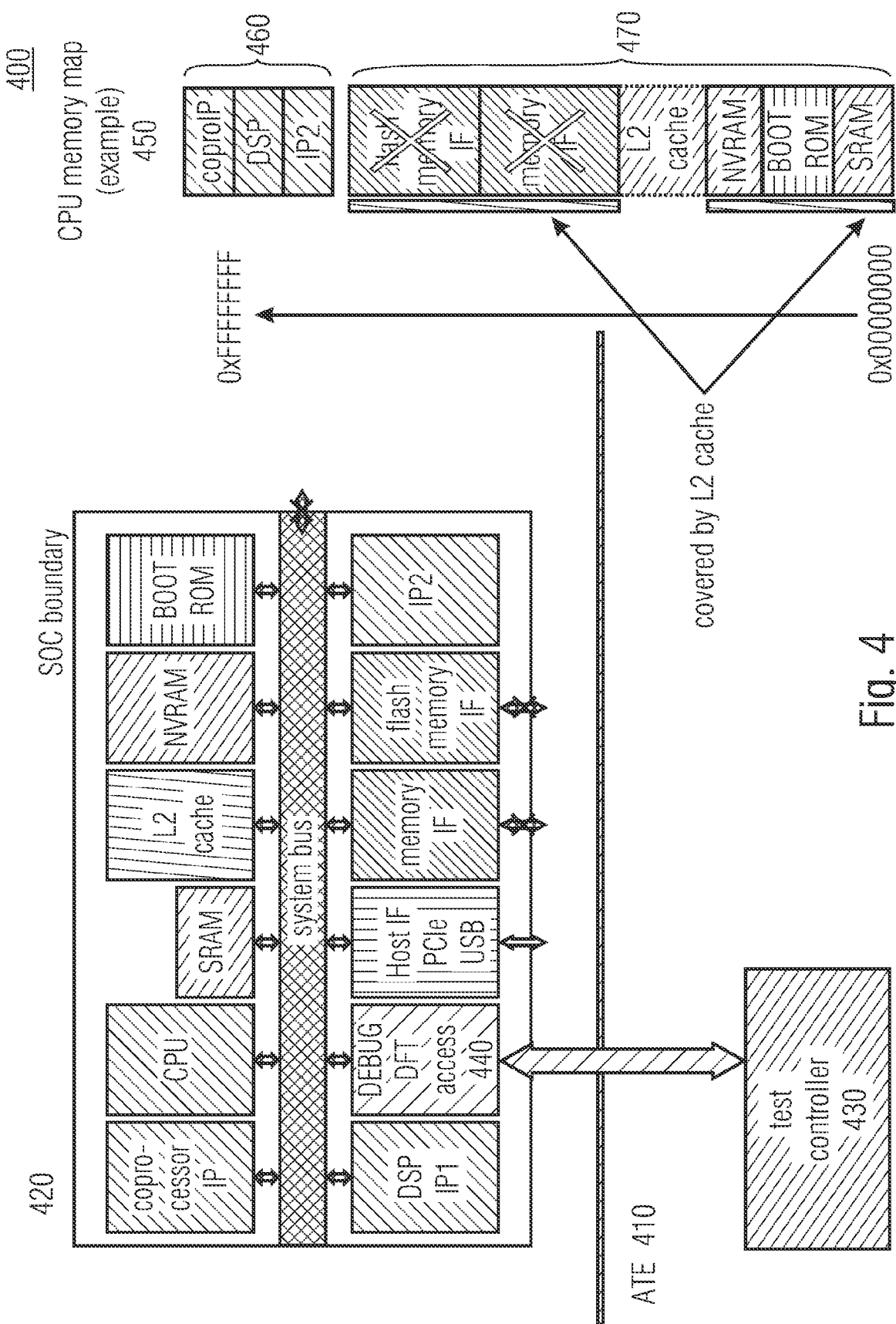
FIG. 4 shows a schematic diagram of an exemplary test arrangement, having an ATE and a DUT, with an exemplary DUT PU memory map, in accordance with embodiments of the present invention.

Test Arrangement According to FIG. 4

FIG. 4 shows an exemplary test arrangement 400, in accordance with embodiments of the present invention. This test arrangement comprises a DUT 420, which is similar to the DUT 300 shown in FIG. 3 and an ATE 410, similar to the ATE on FIG. 1, which has a test controller 430. The test controller 430 of the ATE 410 is connected to the DUT 420 via its debug DfT interface 440.

FIG. 4 further shows an exemplary processing unit memory map. The processing unit memory map 450 comprises addresses of processing units 460 such as, for example, coprocessor, DSP, and/or custom IP blocks, and addresses of memory units 470 such as for example, L2 cache, NVRAM, BOOTRAM, SRAM, and addresses of the non-available flash memory, and/or memory or mass storage. The memory units 470 are covered by L2 cache.

In a conventional solution, the test controller 430 of an ATE 410 uploads and/or downloads program code and/or test data on/from the DUT 420 via a debug DfT interface 440. The program code and/or test data are required to comply with the memory size limitations.

In some solutions, the RAM size may also be extended by repurposing the L2 cache as RAM.

Limitations of the conventional solutions are small RAM size of the DUT 420 and the relatively slow upload and/or download speed between the test controller 430 of the ATE 410 and the DUT 420 via the debug DfT interface 440.

During conventional tests, the Host interface of the SOC design is typically operating in mission and/or operation mode, but in contrast to the inventive test arrangement, nothing is attached to it. Therefore, in a conventional test arrangement, it also could be disabled, because the operational behavior cannot be tested otherwise than with Design for Test (DfT) building blocks or methodologies. One of the key differentiator between the conventional and the inventive test arrangement is that in the inventive test arrangement the ATE is connected to the DUT over the host interface, and the ATE is also testing the host interface via an information exchange between the ATE and the DUT over the host interface.

Additionally, conventional solutions do not offer on-the-fly external analysis and monitoring capabilities as displayed by the invention.

Figure 5:
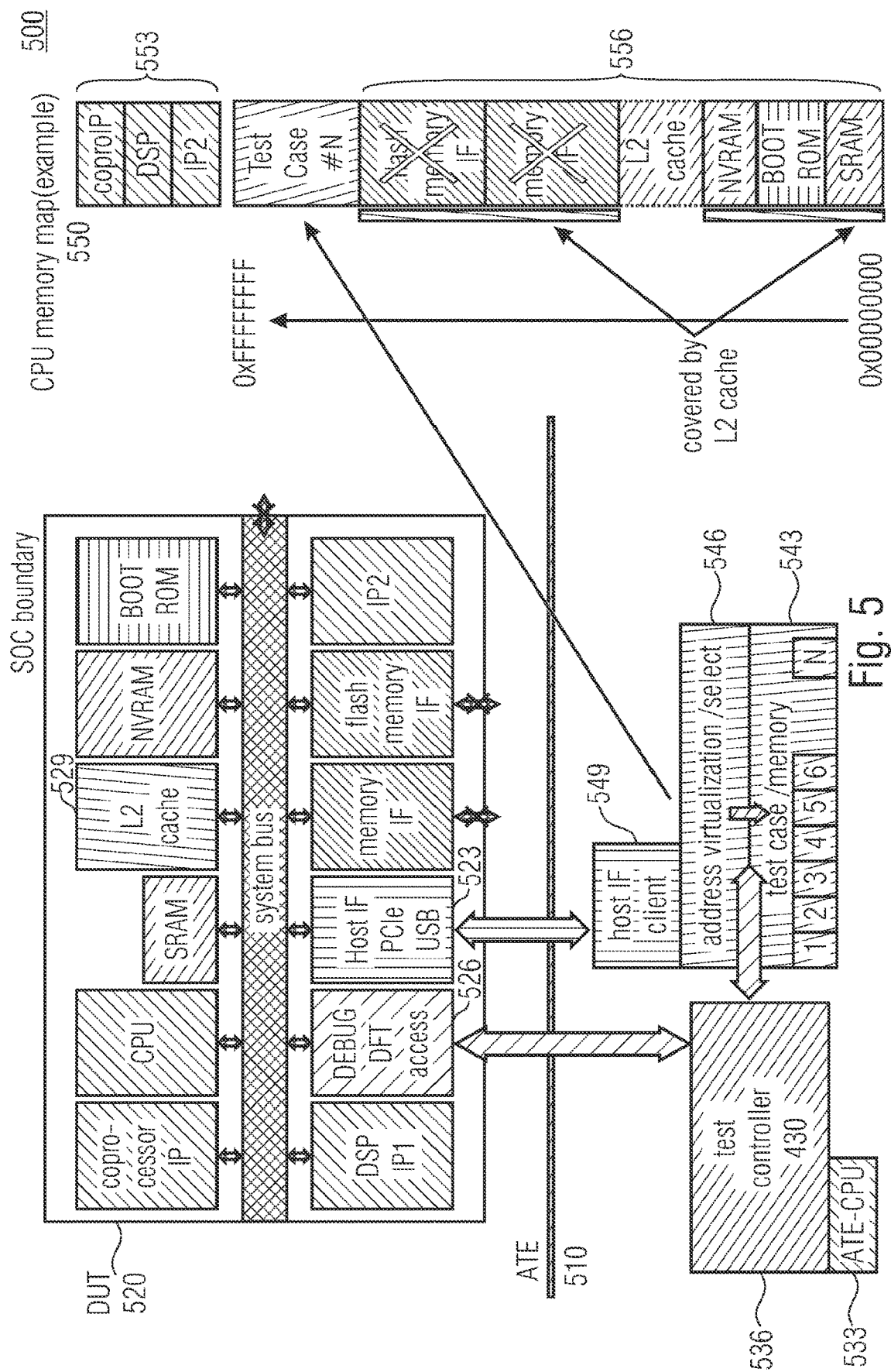
FIG. 5 shows an exemplary test arrangement, in accordance with embodiments of the present invention.

Test Arrangement According to FIG. 5

FIG. 5 shows an exemplary test arrangement 500, in accordance with embodiments of the present invention. The test arrangement 500 comprises an embodiment of an ATE 510, similar to the ATE 110 on FIG. 1, and a DUT 520, which is similar to the DUT 300 shown in FIG. 3. The ATE 510 comprises a test controller 536 and an ATE-processing unit 533, a Host interface client 549 and a shared memory 543 which uses an address virtualization 546. The shared memory is accessible by the test controller 536 and by the DUT 520 over the host interface client 549 such as a PCIe or a USB. The host interface client 549 of the ATE 510 is connected to the host interface 523 of the DUT. Typically the interface is, for example, a serial interface, which is latency-tolerant.

FIG. 5 further shows an exemplary memory map 550. The memory map comprises the addresses of the processing units 553 such as, for example, a coprocessor, a DSP, and/or other custom IP blocks. The memory map further comprises addresses of memory units 556 such as an SRAM, a BOOT ROM, an NVRAM, a L2 Cache 529, non-available mass storages and/or flash memory interfaces and the address of the shared memory. All memory units 556 may be covered by L2 Cache 529.

The ATE processing unit 533 and/or the test controller 536 of the ATE 510 is configured to upload a program to the DUT 520 via the debug DfT interface 526. The program uploaded to the DUT 520 is configured to initialize the DUT, to initialize and configure the high-speed interface, to set up the ATE 510 as a link partner, to initialize and/or configure the shared memory 543 and initialize and/or configure the caching of the shared memory by the L2 cache 529. The test controller 536 then selects certain test case and configures the address virtualization 546 of the shared memory 543. The test controller 536 is further configured to make the DUT 520 run a test case stored on the shared memory 543 via the debug DfT interface 526. During the DUT 520 running a test case, the test controller 536 may analyze results of previous tests, monitor the execution of the current test, select the next test case and/or run a new test case if, for example, the processing unit of the DUT 520 has, for example, more than one core.

In other words, the test controller 536 and/or the ATE processing unit 533 of the ATE 510 is configured to upload a program to the DUT 520 in order to configure the DUT 520 to access to the shared memory 543 via a faster second host interface 523. The test controller 536 and/or the ATE processing unit 533 is further configured to configure the address virtualization 546 of the shared memory 543 and make the DUT 520 run the selected test case on the shared memory 543 by sending program codes and/or test data over the debug DfT 526 and/or host interface 549, 523.

For the execution of the test by the DUT, the ATE-side virtualization is not necessary. The DUT could also operate on a "big memory lake", but from an inventive, efficient ATE perspective, the isolation of the test cases and/or the ability to execute preparation and/or DUT execution and/or result analysis in parallel on the ATE side enables a higher throughput of the ATE.

In other words the inventive ATE is configured to follow the steps below.

1. The Debug Access Port (DAP) or the debug DfT interface 526 is used to hold the DUT 520 in hold state after reset.

2. The DAP 526 is used by the Test Controller 536 and/or the ATE processing unit 533 to load a small Test Executable Program into the DUT 520 and run it, in order to a. Initialize the DUT digital semiconductor Chip and/or the processing unit; b. Initialize and configure the HSIO or the Host interface, such as a PCIe interface, and to set up a component in the ATE system 510 as link partner to provide a certain memory range of the digital semiconductor system memory and/or processing unit memory;

c. Initialize the "HSIO Memory" to be cached, for example, by the L2 Cache 529 as well, or, for example, by the processing unit.

3. The test controller 536 is configured to select a certain test case, such as, for example, #3.

4. Invalidate and/or reset the L2 Cache, for example, by the processing unit.

5. Via DAP: Call to start address of the test case in "HSIO Memory", for example, by the processing unit.

6. The test case executes, and writes results also into the "HSIO Memory", for example, by the processing unit.

7. The program flow returns to a "Debug Control", that means that the processing unit waits for the DAP.

8. If more cases available, the Test Controller may select the next test case and go to item 4 and/or jump back to or and/or execute the steps from Step 4 in this list.

9. In the background, a result analysis of the already finished test cases may start.

Additionally, the execution of the current test case can be monitored. The memory images for the next devices may be prepared and/or refreshed if needed. This requires a dual-ported memory to be implemented in the ATE Controller hardware and/or in all ATE processing units.

10. The HSIO interface used as second interface or as interface accessing the shared memory on the ATE side is thoroughly tested in operation mode, operational behavior can be diagnosed and unexpected operational states can be analyzed.

Figure 6:
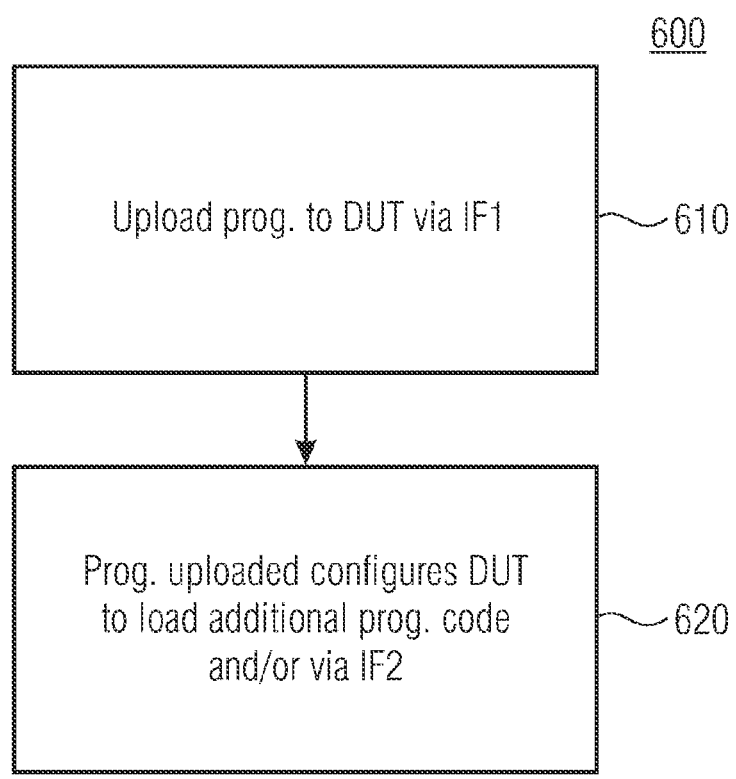
FIG. 6 shows a flowchart of an exemplary method for uploading a program to the DUT via the first interface in order to configure the DUT to load additional data and/or program code, in accordance with embodiments of the present invention.

Method According to FIG. 6

FIG. 6 shows a flow chart 600 of a method according to an embodiment of the present invention. The method comprises uploading a program to a DUT, similar to DUT 300 on FIG. 3, via a first interface 610. The method also comprises the step where the program uploaded configures the DUT to load additional program code and/or data via the second interface 620.

This method is based on the same consideration as the above-described embodiments. Also, the methods may be supplemented by any of the features, functionalities and details described herein.

For example, the method described above can optionally be supplemented by any of the features/functionalities/details described with respect to FIG. 5, both individually or in combination.

Benefits of the Invention

The inventive ATE may have the following benefits over conventional solutions:

Many known HSIO based data buses provide a memory mapped use model. PCI Express™ is the most prominent example here: an extension device announces that it wants so or to provide a certain memory and/or I/O area. A resource manager in the operating environment of the processing unit finds a matching free space and assigns a proper start address for or to the resource. What is (behind) that resource, such as, for example, a true memory or a control register, is implementation dependent. This methodology is, for example, available at, but not limited to PCI Express™.

The usage of, for example, a PCI Express™ card as memory extender and hence as a source of program code and/or data is not practical known, in particular not (in) for test purposes.

Practical observation for many HSIO interfaces is that they are used to control peripheral devices, by memory mapping control registers and/or also data areas in(to) the global memory map of a computer system.

The data areas are used as a source for a computer code the processing unit of the computer system executes, for example, as a processing unit memory extension. The test case code shows up at certain address in the processing unit memory. Execution starts by a jump or a call to that address, which may be initiated by the test controller.

Processing unit caches may be configured in a way that such extension of a memory is accepted as normal system memory. For example, it would be needed to program the cached memory ranges accordingly, which is a normal use case. For example, no special DfT is needed.

Running tests of a digital semiconductor design in mission mode is aimed at identifying failures in the e.g. communication amongst the various incorporated IP blocks. For example, the tests generate a data "traffic" from one IP to others. One key test item often is the usage of HSIO buses, such as, for example, PCI Express and USB but not limited to those, in a mission mode. Operation of those interfaces challenges traffic across clock domains in the design under test. Testing the HSIO interface as such for stability is a by-product of the described invention.

Many, also bigger and/or more realistic test cases are possible now.

No extra download and/or copy time overhead is needed. Downloading during execution time via HSIO Bus. Run time performance is assured and/or improved by the L2 Cache.

The test controller may also manage multiple test cases and let the DUT "step through".

The execution of test cases can be concurrently monitored and analyzed by the ATE.

Further General Improvements

The invention may be further improved by adding security-features to the invention, which may include the following features:

An authentication of the ATE and/or the tester against the first and/or second interface:

The ATE and/or the tester may be required to authenticate itself against the first and/or second interface using, for example, cryptographic means and/or secret credentials to prove its identity required to, for example, establish a communication.

An authorization of the ATE and/or the tester against the first and/or second interface:

The ATE and/or the tester may be required to authorize itself against the first or second interface using, for example, cryptographic means and/or secret credentials to gain privileges on the device to, for example, access otherwise restricted functions.

An integrity check of the communication between the DUT and the ATE and/or the tester:

The communication between the DUT and the ATE and/or the tester and/or the first and/or second interface of the ATE may be protected against modifications using standard and/or proprietary data integrity checking methods, such as, for example, hashes.

An encryption of the communication between the DUT and the ATE and/or the tester:

The communication between the DUT and the ATE and/or the tester and/or the interface(s) of the ATE may be encrypted using standard encryption schemes and/or proprietary encryption methods.

The invention may be further improved by adding compression-features to the invention, which may include the following features:

Compression of the communication between the DUT and the ATE and/or the tester:

The communication between the DUT and the ATE and/or the tester or the primary and/or secondary interface of the ATE may be compressed using standard or proprietary, lossy or lossless compaction means where the ATE and/or the tester compresses the data to send to the device which is decompressed by the device and/or the device compresses the data sent or data to send to the tester and/or the tester decompresses the data.

A compression of the communication between the DUT and the ATE may also requires, that:

The required compaction and/or decompaction method can or may be uploaded to the DUT as part of the program code using the first and/or second interface.

Implementation Alternatives

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

Depending on certain implementation requirements, embodiments of the invention may be implemented in hardware or in software. The implementation may be performed using a digital storage medium, for example, a floppy disk, a DVD, a CD, a ROM, a PROM, an EPROM, an EEPROM or a FLASH memory, having electronically readable control signals stored thereon, which cooperate (or are capable of cooperating) with a programmable computer system such that the respective method is performed.

Some embodiments according to the invention comprise a data carrier having electronically readable control signals, which are capable of cooperating with a programmable computer system, such that one of the methods described herein is performed.

Generally, embodiments of the present invention may be implemented as a computer program product with a program code, the program code being operative for performing one of the methods when the computer program product runs on a computer. The program code may, for example, be stored on a machine-readable carrier.

Other embodiments comprise the computer program for performing one of the methods described herein, stored on a machine-readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitory.

A further embodiment of the inventive method is, therefore, a data stream or a sequence of signals representing the computer program for performing one of the methods described herein. The data stream or the sequence of signals may for example, be configured to be transferred via a data communication connection, for example, via the internet.

A further embodiment comprises a processing means, for example, a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example, a field programmable gate array) may be used to perform some or all of the functionalities of the methods described herein. In some embodiments, a field programmable gate array may cooperate with a microprocessor in order to perform one of the methods described herein. Generally, the methods may be performed by any hardware apparatus.

The apparatus described herein may be implemented using a hardware apparatus, or using a computer, or using a combination of a hardware apparatus and a computer.

The apparatus described herein, or any components of the apparatus described herein, may be implemented at least partially in hardware and/or in software.

The methods described herein may be performed using a hardware apparatus, or using a computer, or using a combination of a hardware apparatus and a computer.

The above-described embodiments are merely illustrative for the principles of the present disclosure. It is understood that modifications and variations of the arrangements and the details described herein will be apparent to others skilled in the art. It is the intent, therefore, to be limited only by the scope of the pending patent claims and not by the specific details presented by way of description and explanation of the embodiments herein.

What is claimed is:

1. An automated test equipment (ATE) for testing a device under test (DUT), the automated test equipment comprising:
   a first communications interface configured to communicatively couple to the DUT; and
   a second communications interface configured to communicatively couple to the DUT,
   wherein the ATE is configured to upload a program to the DUT for execution by a processor of the DUT using the first communications interface, and
   wherein the program is operable to configure the DUT to communicate with the ATE via the second communications interface, and
   wherein further the second communications interface is operable to communicate at a higher data rate than the first communications interface,
   wherein the ATE is configured to cause an invalidation of a cache of the DUT, and
   wherein the ATE loads the program into the cache for execution by the DUT.

2. The automated test equipment according to claim 1, wherein the program uploaded to the DUT via the first communications interface is operable to configure the DUT to load additional program code via the second communications interface.

3. The automated test equipment according to claim 1, wherein the program uploaded to the DUT via the first communications interface is operable to configure the DUT to access memory external to the DUT via the second communications interface using a memory mapping technique.

4. The automated test equipment according claim 1, wherein the program uploaded to the DUT via the first communications interface is operable to configure a resource manager of the DUT to allocate a memory range of a memory addressable by a processing unit of the DUT for access to the second communications interface.

5. The automated test equipment according to claim 1, wherein the program uploaded to the DUT communicates to the ATE utilizing an application protocol to exchange data.

6. The automated test equipment according to claim 1, wherein the ATE is configured to authenticate itself to the DUT.

7. The automated test equipment according to claim 1, wherein the ATE is configured to communicate with the DUT via encrypted communications.

8. The automated test equipment according to claim 1, wherein the ATE is configured to compress information sent to the DUT, and wherein further the ATE is configured to decompress information received from the DUT.

9. The automated test equipment according to claim 1, wherein the program uploaded to the DUT is configured to decompress information received from the automated test equipment, and wherein further the DUT is configured to compress information sent to the processor.

10. The automated test equipment according to claim 1, wherein the ATE is configured to cause a processing unit of the DUT to execute a program stored in a memory shared with the ATE.

11. An automated test equipment for testing a device under test comprising:
   a processor;
   a memory that is shared with the device under test;
   a first communications interface configured to communicatively couple the device under test to the processor of the automated test equipment; and
   a second communications interface configured to communicatively couple the device under test to the processor of the automated test equipment,
   wherein the automated test equipment is configured to upload a program to the device under test using the first communications interface,
   wherein the program is also operable to configure the device under test to communicate with the processor via the second communications interface,
   wherein the second communications interface is operable to communicate at a higher data rate than a data rate of the first communications interface,
   wherein the processor is configured to cause a processing unit of the device under test to execute a test program which is stored in the memory that is shared, and
   wherein the test program initializes a memory range, onto which the memory range of the memory of the automated test equipment is mapped, and wherein an extension memory provided by the second communications interface appears to a processing unit of the device under test as a normal system memory.

12. The automated test equipment of claim 11 wherein the test program is loaded to the device under test via the second communications interface.

13. The automated test equipment according to claim 11, wherein the test program uploaded to the device under test initializes a processing unit of the device under test, initializes the device under test to communicate via the second communications interface, and configures the device under test to connect to the memory of the automated test equipment via the second communications interface, and to provide a memory range of the memory of the automated test equipment as a memory range useable by the processing unit of the device under test.

14. The automated test equipment according to claim 11, wherein the processor is configured to authorize itself to the device under test using a cryptographic test.

15. The automated test equipment according to claim 11, wherein the processor is configured to communicate with the device under test via encrypted communications.

16. The automated test equipment according to claim 11, wherein the processor is configured to compress information sent to the device under test, and wherein the processor is configured to decompress information received from the device under test.

17. The automated test equipment according to claim 16, wherein the program uploaded to the device under test is configured to decompress information received from the processor of the automated test equipment.

18. A non-transitory computer-readable medium having instructions stored thereon that, responsive to execution by an electronic system, cause said electronic system to perform operations, the operations comprising:
   uploading a program from an automated test equipment to a device under test using a first communications interface,
   wherein the program is operable to configure the device under test to communicate with the automated test equipment via a second communications interface,
   wherein the second communications interface is operable to communicate at a higher data rate than the first communications interface; and
   causing the device under test to execute the program,
   wherein the automated test equipment is configured to cause an invalidation of a cache of the device under test, and
   wherein the automated test equipment loads a program into the cache for execution by the device under test.

* * * * *